US005355096A

United States Patent [19]
Kobayashi

[11] Patent Number: 5,355,096
[45] Date of Patent: Oct. 11, 1994

[54] COMPACE HBT WIDE BAND MICROWAVE VARIABLE GAIN ACTIVE FEEDBACK AMPLIFIER

[75] Inventor: Kevin W. Kobayashi, Torrance, Calif.
[73] Assignee: TRW Inc., Redondo Beach, Calif.
[21] Appl. No.: 87,949
[22] Filed: Jul. 6, 1993
[51] Int. Cl.5 .............................................. H03G 3/12
[52] U.S. Cl. ................................... 330/278; 330/282
[58] Field of Search ............... 330/129, 278, 282, 285, 330/310

[56] References Cited

U.S. PATENT DOCUMENTS

| 4,771,247 | 9/1988 | Jacomb-Hood | 330/277 |
| 4,816,778 | 3/1989 | Weber | 331/57 |
| 5,047,731 | 9/1991 | Lee | 330/282 |
| 5,051,372 | 9/1991 | Sasaki | 437/5 |
| 5,051,705 | 9/1991 | Moghe | 330/282 |

FOREIGN PATENT DOCUMENTS

| 0136910 | 6/1987 | Japan | 330/282 |
| 0190310 | 8/1991 | Japan | 330/282 |

Primary Examiner—Steven Mottola
Assistant Examiner—Teep H. Nguyen

[57] ABSTRACT

A variable gain amplifier includes a first transistor including a base, and an emitter, and a collector. A first parallel feedback device connected to the collector and the base of the first transistor provides an inductive impedance. A second parallel feedback device connected to the collector and the base of the first transistor provides a variable resistive impedance and includes a monolithically integrated p-i-n diode having a quiescent bias current flowing therethrough. The gain response of the first transistor is related to the variable resistive impedance of the second parallel feedback device.

12 Claims, 3 Drawing Sheets

COMPACT HBT WIDE BAND MICROWAVE VARIABLE GAIN ACTIVE FEEDBACK AMPLIFIER

TECHNICAL FIELD

This invention relates to variable gain amplifiers and, more particularly, to variable gain amplifiers using a p-i-n diode.

BACKGROUND OF THE INVENTION

Maturing silicon bipolar and Gallium Arsenide (GaAs) hetero-junction bipolar technologies (HBT) have made microwave monolithic integrated circuits (MMIC) feasible. A common goal for any monolithic circuit is to use design and fabrication techniques to reduce chip size, increase ease of implementation, and reduce costs in high volume production. These design and fabrication techniques should not compromise performance, and if possible, should improve performance.

Three conventional variable gain amplifiers exist which use bipolar technology. A first approach uses a current steering method in which current is supplied across an amplifier load resistor to change a voltage swing through the load resistor. The first current steering approach is implemented using emitter-coupled logic (ECL) and is compact in size. However, the first approach is noisy due to additional transistors needed to accomplish current steering. The current steering approach is somewhat stable at microwave frequencies but is not desirable at high frequencies. Third order intermodulation performance (IP3) is generally limited.

A second approach adjusts current through an amplifying transistor to change an effective transconductance. The second approach has a favorable or low noise factor/gain ratio and an unfavorable or high IP3 gain ratio, and requires a biasing scheme for controlling gain.

A third approach uses electronically controllable resistors in parallel or series feedback amplifiers. While the third approach has acceptable gain, bandwidth, linearity, and noise, an expensive off-chip discrete variable resistance is required.

Variable gain amplifiers according to the third approach typically use a p-i-n diode as a variable resistance element in the parallel or the series feedback path. Two discrete components are required for the third approach: a transconductance device, for example a FET or bipolar device; and a p-i-n diode. The two discrete components are typically integrated into an expensive multi-component hybrid. Furthermore, VGA designs using the p-i-n diodes typically include area-consuming spiral inductors in the feedback path and matching networks to obtain high frequency (e.g. microwave) response.

Fabrication of the spiral inductor on a monolithic chip requires careful modeling, a complicated fabrication process, and large surface areas on the Silicon or GaAs wafer. The surface area required for an inductor increases as the inductance value increases. Since high frequency applications typically require inductors with high inductance, the surface area of these inductors adversely affect chip size.

SUMMARY OF THE INVENTION

In accordance with the teaching of the present invention, a variable gain amplifier includes a first transistor including a base, an emitter, and a collector. A first parallel feedback device connected to the collector and the base of the first transistor provides an inductive impedance. A second parallel feedback device connected to the collector and the base of the first transistor provides a variable resistive impedance and includes a monolithically integrated p-i-n diode having a quiescent bias current flowing therethrough. The gain response of the first transistor is related to the variable resistive impedance of the second parallel feedback device.

In another feature of the invention, a control means controls the quiescent bias current flowing through the p-i-n diode to vary the variable resistive impedance.

In another feature of the invention, a second transistor connected to the first transistor forms a Darlington pair. The second transistor has a base, an emitter, and a collector. The collector of the first transistor is connected to the collector of the second transistor and the emitter of the first transistor is connected to the base of the second transistor.

In still another feature of the invention, the first transistor and the p-i-n diode are fabricated using monolithic hetero-junction bipolar technology.

In yet another feature of the invention, the first parallel feedback device includes a network for providing an active feedback inductive impedance. The inductive network device includes a first tuning capacitor and third and fourth transistors each including an emitter, a base and a collector. The emitter of the third transistor is connected to the collector of the fourth transistor. The base of the third transistor and the emitter of the fourth transistor are coupled by the first tuning capacitor. A first tuning resistor is connected to the collector of the third transistor. A second tuning resistor is connected to the base of the fourth transistor. The inductive network device further includes an emitter resistor and a first biasing resistor connected to the base of the third transistor, to the first tuning resistor and to the emitter resistor. The inductive impedance of the inductive network device is related to a capacitance of the first tuning capacitor and to resistance values of said first and second tuning resistors.

In another feature of the invention, the inductive network device and the p-i-n diode are monolighically integrated.

Other objects, features and advantages will be readily apparent.

BRIEF DESCRIPTION OF THE DRAWINGS

The various advantages of the present invention will become apparent to those skilled in the art after studying the following specification and by reference to the drawings in which.

DESCRIPTION OF THE PREFERRED EMBODIMENT

Figure 1:
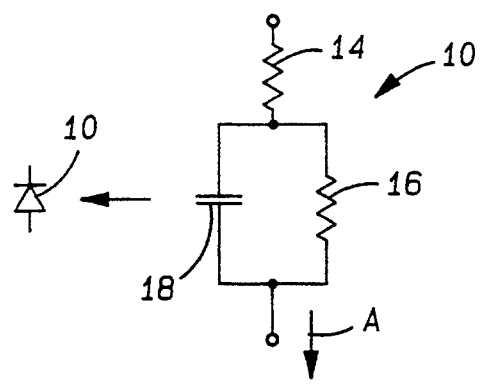
FIG. 1 is an electrical schematic of a p-i-n diode circuit model.

In FIG. 1, a p-i-n diode circuit model 10 is shown and includes a contact resistance ($R_C$) 14, a dynamic resistance ($R_D$) 16, and a diffusion capacitance ($C_D$) 20. The contact resistance $R_C$ 14 is typically constant for a p-i-n diode. Circuit elements of the p-i-n diode circuit 10 are defined as follows:

$$R_c = 4 \text{ ohms},$$

$$R_o = n \cdot \frac{V_t}{I_d},$$

$$V_t = \frac{kT}{q},$$

$$C_D = (4 \text{nf}) I_d,$$

and $$n = 2$$

where $I_d$ is shown by arrow "A" in FIG. 1, n is the ideality factor, k is Boltzmann's constant, T is temperature in Kelvin, and q is electronic charge.

From a monolithic standpoint, a p-i-n diode can be implemented with hetero-junction bipolar technology (HBT) using epitaxial layers of a base-collector junction of an HBT transistor. So far p-i-n diodes have not been used in HBT VGAs for several reasons. First, the epitaxial structure is optimized for transistor performance and not for an ideal p-i-n diode. Second, the HBT p-i-n diode has a high diffusion capacitance/contact resistance ratio and, as a result, a broad band purely resistive impedance is difficult to achieve. Third, scaling the p-i-n diode down to reduce the diffusion capacitance $C_D$ increases the contact resistance $R_C$ 14.

Since the HBT p-i-n diode has a high diffusion capacitance/contact resistance ratio, the HBT p-i-n diode can be scaled smaller to reduce the diffusion capacitance. However, reducing the diffusion capacitance increases the contact resistance and prevents effective use of the p-i-n diode in series feedback, broad band VGA because the small scale HBT p-i-n diode at the emitter of the HBT transistor amplifier (in a series feedback configuration) will degrade the maximum gain performance and limit the amount of positive variable gain range. Thus, for broad band microwave performance, the series feedback VGA orientation integrated monolithically with HBT technology is not feasible.

If the smaller scaled p-i-n diode is used in a parallel feedback VGA, a maximum gain setting is determined by a large feedback resistance (p-i-n diode off) instead of the contact resistance $R_c$. Some bandwidth degradation occurs due to the parallel pin dynamic (diffusion plus depletion) capacitance.

Figure 2:
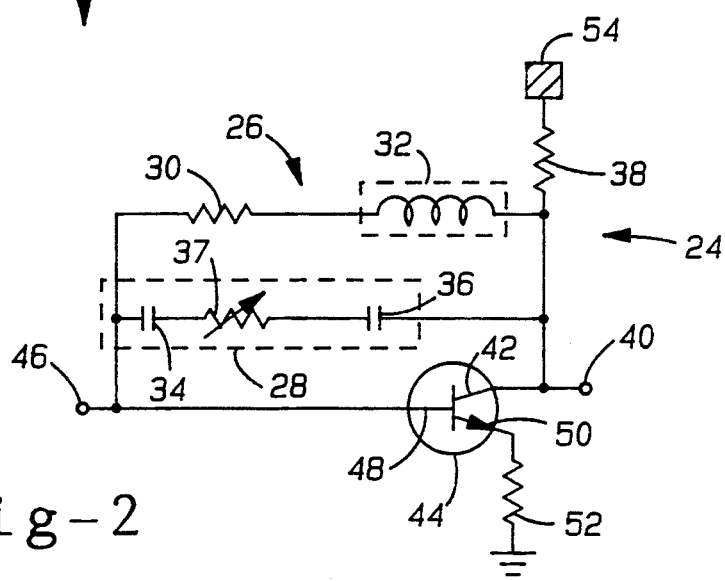
FIG. 2 is a simplified electrical schematic of a variable gain amplifier.

In FIG. 2, a simplified diagram of a variable gain amplifier 24 is shown and includes first and second parallel feedback paths 26 and 28. The first parallel feedback path 26 includes a resistor 30 and an inductor 32. The second parallel feedback path 28 includes DC blocking capacitors 34 and 36 and a variable resistor 37 connected therebetween. A resistor 38 is connected to an output node 40, to a collector 42 of a transistor 44, to the passive inductor 32, and to the capacitor 36. An input node 46 is connected to a base 48 of the transistor 44, to the capacitor 34, and to the resistor 30. An emitter 50 of the transistor 44 is connected to the resistor 52 which is connected to ground. A voltage source 54 is connected to the resistor 38.

The first parallel feedback path 26 provides inductive peaking and the second parallel feedback path 28 provides a variable resistance to control gain of the transistor 44. The first parallel feedback path offsets the diffusion capacitance 20 of the p-i-n diode which generates the variable resistance symbolized by the variable resistor 37 to improve gain and bandwidth response.

Figure 3:
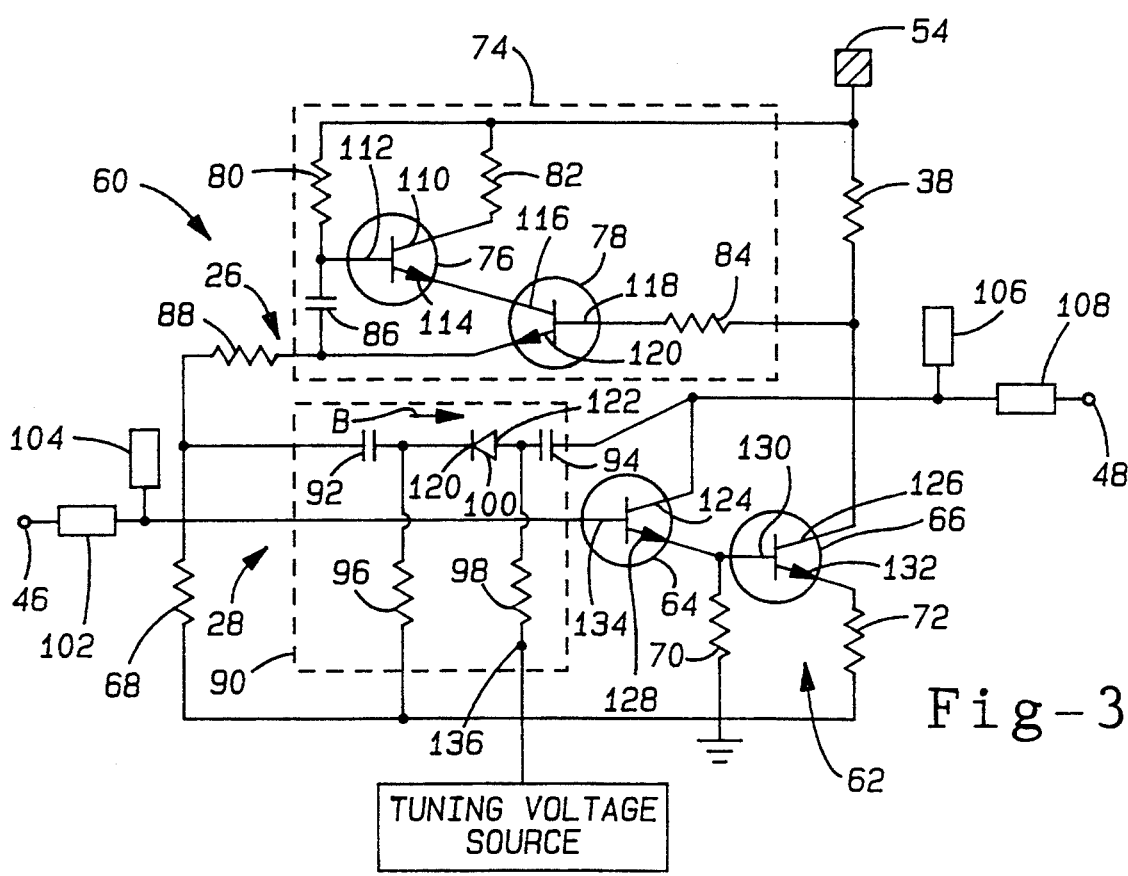
FIG. 3 is a detailed electrical schematic of a variable gain active feedback amplifier according to the present invention.

In FIG. 3, a detailed variable gain active feedback amplifier 60 according to the present invention is shown. The present invention overcomes the above described problems with using a HBT p-i-n diode in the relatively compact monolithic HBT VGA 60. The transistor 44 has been replaced by a Darlington pair 62 including transistors 64 and 66, biasing resistors 68 and 70, and a series feedback resistor 72. The inductor 32 has been replaced by an active feedback inductor network 74 including transistors 76 and 78, a biasing resistor 80, impedance tuning resistors 82 and 84, and an impedance tuning capacitor 86. The active feedback inductor network 74 can be tuned for different inductive impedances by adjusting the impedance tuning resistors 82 and 84 and the impedance tuning capacitor 86. The active feedback inductor network 74 is described further in my co-pending U.S. patent application entitled "Bipolar Microwave Monolithic Voltage Controlled Oscillator Using Active Inductors", Ser. No. 8/088,009 filed, Jul. 6, 1993, hereby incorporated by reference. A series feedback resistor 88 is connected to the active feedback inductor network 74 and provides resistive impedance for the first parallel feedback path 26.

The second parallel feedback path 28 providing variable resistance includes a p-i-n diode network 90 including first and second DC blocking capacitors 92 and 94, first and second biasing resistors 96 and 98, and a p-i-n diode 100. Optional microstrip tuning elements 102, 104, 106 and 108 enhance input and output voltage standing wave ratio (VSWR) performance.

The voltage supply 54 is connected to the bias resistor 80, the impedance tuning resistor 82, and the load resistor 38. The impedance tuning resistor 82 is connected to a collector 110 of the transistor 76. The bias resistor 80 is connected to a base 112 of the resistor 76 and to the impedance tuning capacitor 86. An emitter 114 of the transistor 76 is connected to a collector 116 of the transistor 78. A base 118 of the transistor 78 is connected to the impedance tuning resistor 84.

A cathode 120 of the p-i-n diode 100 is connected to the first blocking capacitor 92 and the first biasing resistor 96. An anode 122 of the p-i-n diode 100 is connected to the second biasing resistor 98 and the second blocking capacitor 94. The second blocking capacitor 94 is also connected to a collector 124 of the transistor 64, a collector 126 of the transistor 66, the impedance tuning resistor 84, the resistor 38, and the microstrip tuning elements 106 and 108.

An emitter 128 of the transistor 64 is connected to a base 130 of the transistor 66 and to the biasing resistor 70. An emitter 132 of the transistor 66 is connected to the series feedback resistor 72. A base 134 of the transistor 64 is connected to the biasing resistor 68, the series feedback resistor 88, the first blocking capacitor 92, and the microstrip tuning elements 102 and 104. A tuning voltage source 136 controls a quiescent bias current (indicated by arrow "B") through the p-i-n diode 100 to vary the resistance value of the p-i-n diode 100.

As can be appreciated, components of the variable gain active feedback amplifier 60 can be fabricated on a monolithic wafer which is smaller and less expensive than conventional variable gain amplifiers using, for example, spiral inductors. The p-i-n diode 100 and the transistors 64, 66, 76, and 78 can be made using heterojunction bipolar technology. Performance objectives, cost reduction, and size reduction can be achieved using the variable gain active feedback amplifier 60, even at microwave frequencies.

Figure 4:
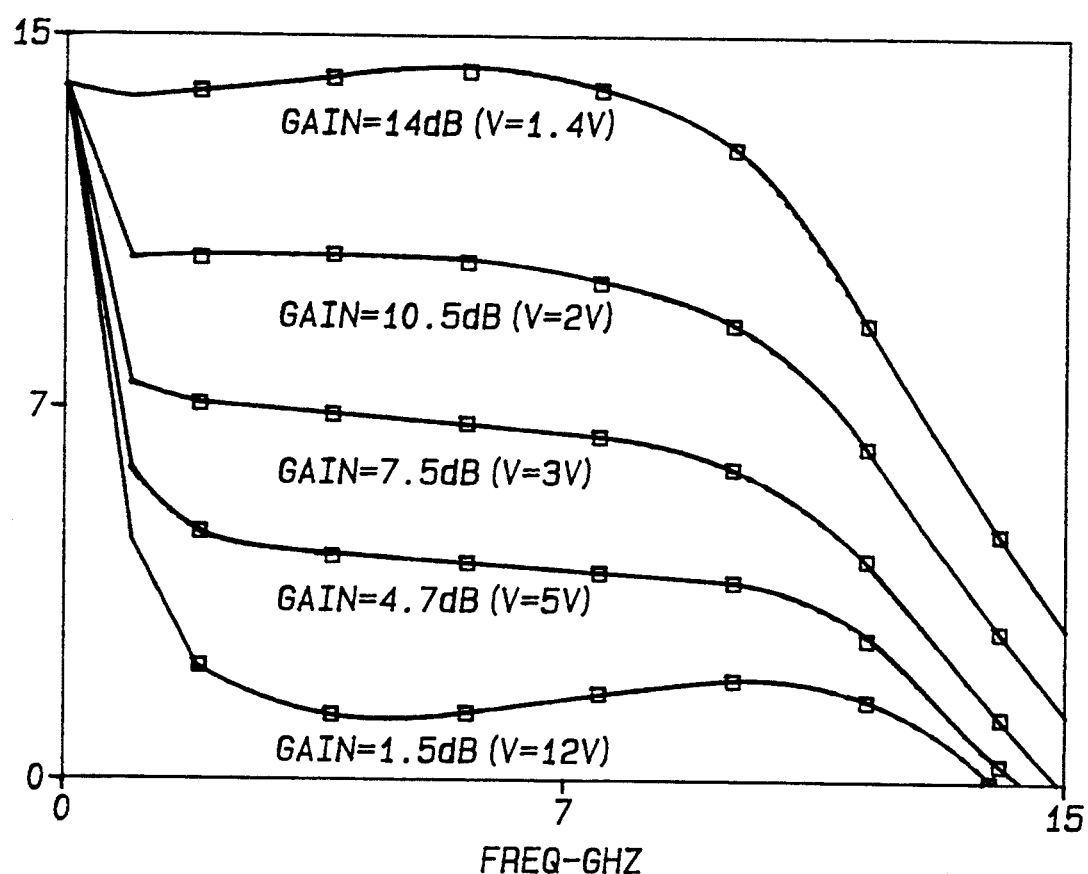
FIG. 4 is a plot of gain response of the variable gain active feedback amplifier as a function of frequency and the tuning voltage supplied by a tuning voltage source.

In FIG. 4, gain response (in dB) is plotted as a function of frequency and the tuning voltage supplied by the tuning voltage source 136. Bandwidth is greater than 10 GHz and dynamic range is about 12dB. The gain is maintained within approximately ±0.5dB across the band at each gain setting. As the tuning voltage supplied by the tuning voltage source 136 increases, the quiescent bias current through the p-i-n diode 100 increases. The variable resistance of the p-i-n diode 100 decreases causing the gain to decrease.

Figure 5:
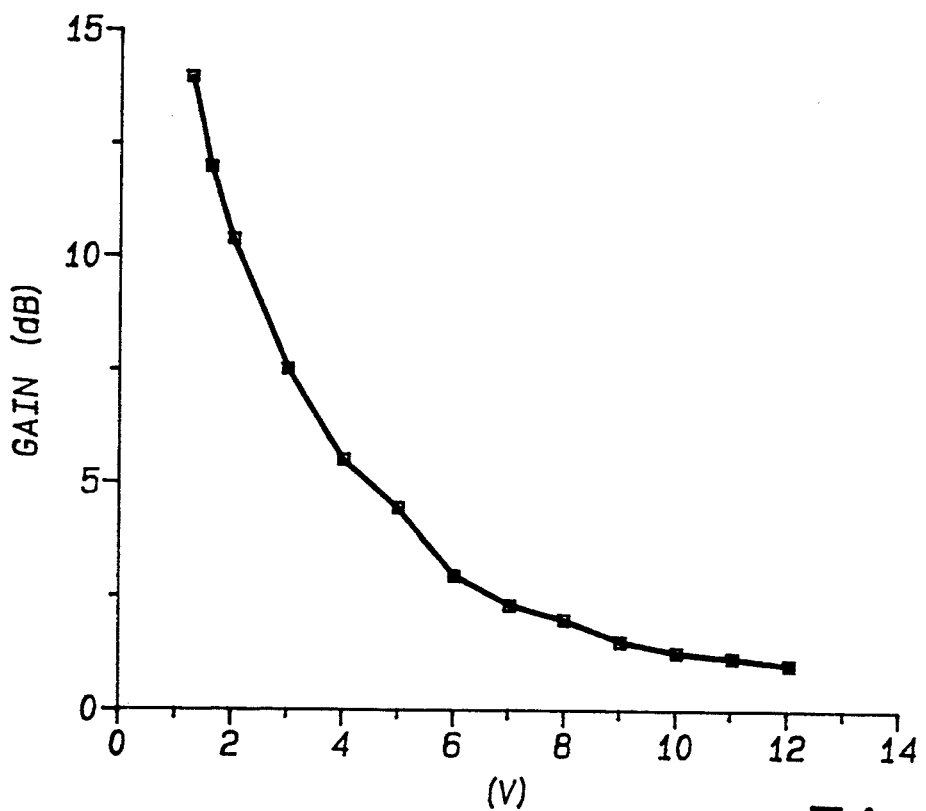
FIG. 5 is a plot of gain as a function of the tuning voltage.

FIG. 5 illustrates gain as a function of the tuning voltage supplied by the tuning voltage source 136. Gain sensitivity is lower at higher currents (or higher tuning voltages) because the dynamic resistance 16 becomes the same order of magnitude as the contact resistance 14. The contact resistance 14 (fixed) limits the dynamic range.

Figure 6:
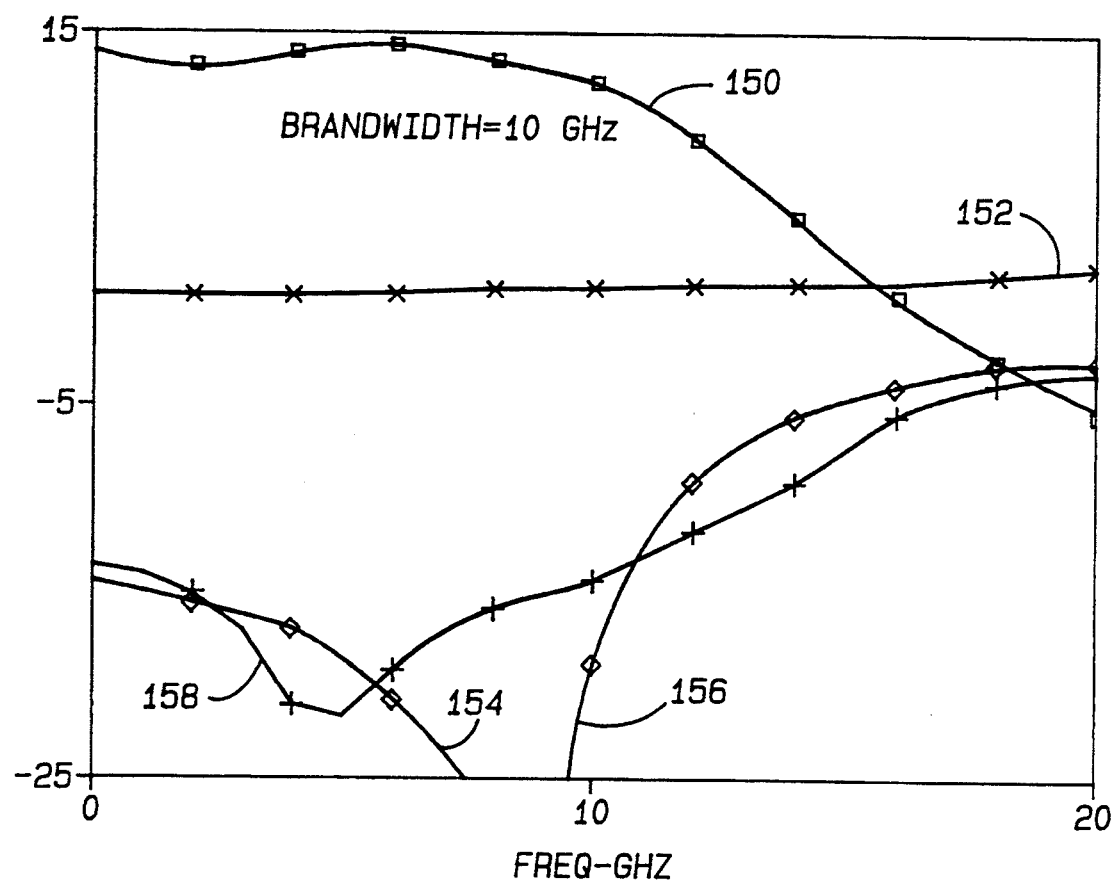
FIG. 6 is a plot of gain, stability, and return-loss for a maximum gain setting of the variable gain active feedback amplifier.

In FIG. 6, gain, stability, and return-loss are shown for a maximum gain setting in FIG. 4. Plotted line 150 shows a constant gain of approximately 15dB over a 10 GHz bandwidth. Plotted line 152 illustrates the stability of the variable gain active feedback amplifier 60. Return-loss is a measure of amplitude matching of a node to a 50 ohm impedance. Return-loss less than −10dB is typically considered good. Plotted lines 154 and 156 show the return-loss measured at the output node 48. Line 158 illustrates the return-loss of the input node 46.

As can be appreciated from the foregoing, the monolithic variable gain active feedback amplifier according to the present invention provides stable gain over a wide bandwidth at microwave frequencies, and an improved gain-bandwidth product. The variable gain active feedback amplifier can be fabricated without spiral inductors allowing significant cost and size reduction. The variable gain active feedback amplifier has a high dynamic range using a monolithic p-i-n diode. Other objects, features and advantages will be readily apparent.

The various advantages of the present invention will become apparent to those skilled in the art after a study of the foregoing specification and following claims.

What is claimed is:

1. A variable gain amplifier comprising:
   first transistor including a base, an emitter, and a collector;
   first parallel feedback means connected to the collector and the base of the first transistor for providing an active feedback impedance; and
   second parallel feedback means-connected to the collector and the base of the first transistor for providing a variable resistive impedance and including a monolithically integrated p-i-n diode having a quiescent bias current flowing therethrough,
   wherein a gain response of said first transistor is related to the variable resistive impedance of said second parallel feedback means.

2. The variable gain amplifier of claim 1 further including:
   control means for controlling the quiescent bias current flowing through said p-i-n diode to vary said variable resistive impedance.

3. The variable gain amplifier of claim 2 wherein the control means includes a tuning voltage source connected through a second biasing resistor to said p-i-n diode.

4. The variable gain amplifier of claim 1 further including:
   a second transistor connected to said first transistor to form a Darlington pair and having a base, an emitter, and a collector,
   wherein the collector of the first transistor is connected to the collector of the second transistor and the emitter of the first transistor connected to the base of the second transistor.

5. The variable gain amplifier of claim 1 wherein the first transistor and the p-i-n diode are fabricated using monolithic hereto-junction bipolar technology.

6. The variable gain amplifier of claim 1 wherein the first parallel feedback means includes an indictive network means for providing an active feedback inductive impedance.

7. The variable gain amplifier of claim 6 wherein the inductive network means includes:
   a first tuning capacitor; and
   third and fourth transistors each including an emitter, a bases and a collector, wherein the emitter of the third transistor is connected to the collector of the fourth transistor, and wherein the base of the third transistor and the emitter of the fourth transistor are coupled by the first tuning capacitor.

8. The variable gain amplifier of claim 7 wherein the inductive network means further includes:
   first tuning resistor connected to the collector of the third transistor;
   second tuning resistor connected to the base of the fourth transistor;
   collector resistor connected to said collectors of said first and second transistors; and
   first biasing resistor connected to the base of the third transistor, to the first tuning resistor and to the collector resistor,
   wherein the active feedback inductive impedance of said inductive network means is related to a capacitance value of said first tuning capacitor and to resistance value of said first and second tuning resistors.

9. The variable gain amplifier of claim 8 wherein said inductive network means and said p-i-n diode are monolithically integrated.

10. The variable gain amplifier of claim 1 wherein said second parallel feedback means includes a first DC blocking capacitor connected to a cathode of the p-i-n diode and a second DC blocking capacitor connected to an anode of the p-i-n diode.

11. The variable gain amplifier of claim 1 further including first and second microstrip tuning elements connected to a base of said first transistor and third and fourth microstrip tuning elements connected to a collector of said first transistor, wherein said first, second, third and fourth microstrip tuning elements improve input and output VSWRs.

12. A variable gain amplifier comprising:

first transistor including a base, an emitter, and a collector;

first parallel feedback means connected to the collector and the base of the first transistor for providing an active feedback inductive impedance;

second parallel feedback means connected to the collector and the base of the first transistor for providing a variable resistive impedance and including a monolithically integrated p-i-n diode having a quiescent bias current flowing therethrough, wherein a gain response of said first transistor is related to the variable resistive impedance of said second parallel feedback means;

control means for controlling the quiescent bias current flowing through said p-i-n diode to vary said variable resistive impedance;

a second transistor connected to said first transistor to form a Darlington pair and having a base, an emitter, and a collector, wherein the collector of the first transistor is connected to the collector of the second transistor and the emitter of the first transistor is connected to the base of the second transistor; and a network means in said first parallel feedback path for providing an active feedback inductive impedance including a first tuning capacitor, third and fourth transistors each including an emitter, a base and a collector, wherein the emitter of the third transistor is connected to the collector of the second transistor, and wherein the base of the third transistor and the emitter of the fourth transistor are coupled by the first tuning capacitor, first tuning resistor connected to the collector of the third transistor, second tuning resistor connected to the base of the fourth transistor, a collector resistor connected to said collectors of said first and second transistors, first biasing resistor connected to the base of the third transistor, to the first tuning resistor and to the collector resistor, wherein the active feedback inductive impedance of said inductive network means is related to a capacitance of said first tuning capacitor and to resistance values of said first and second tuning resistors.

* * * * *

UNITED STATES PATENT AND TRADEMARK OFFICE
CERTIFICATE OF CORRECTION

PATENT NO. : 5,355,096
DATED : October 11, 1994
INVENTOR(S) : Kevin W. Kobayashi It is certified that error appears in the above-indentified patent and that said Letters Patent is hereby corrected as shown below:

Title page, item [54] and col. 1, lines 1-3, should read-- COMPANT HBT WIDE BAND MICROWAVE VARIABLE GAIN ACTIVE FEEDBACK AMPLIFIER--

Signed and Sealed this

Second Day of January, 1996

Attest:

BRUCE LEHMAN

Attesting Officer    Commissioner of Patents and Trademarks

UNITED STATES PATENT AND TRADEMARK OFFICE
CERTIFICATE OF CORRECTION

PATENT NO. : 5,355,096
DATED : October 11, 1994
INVENTOR(S) : Kevin W. Kobayashi It is certified that error appears in the above-indentified patent and that said Letters Patent is hereby corrected as shown below:

Title page, item [54] and col. 1, lines 1-3, should read --
COMPACT HBT WIDE BAND MICROWAVE VARIABLE GAIN ACTIVE
FEEDBACK AMPLIFIER--

This Certificate supersedes Certificate of Correction issued
January 2, 1996.

Signed and Sealed this

Twenty-third Day of April, 1996

Attest:

BRUCE LEHMAN

Attesting Officer

Commissioner of Patents and Trademarks